United States Patent [19]

Skarby et al.

[11] Patent Number: 5,551,070
[45] Date of Patent: Aug. 27, 1996

[54] CARTESIAN MULTICARRIER FEEDBACK

[75] Inventors: Ulf Skarby, Lidingo; Par Bergsten, Solna; Bo Hedberg, Kista, all of Sweden

[73] Assignee: Telefonaktiebolaget LM Ericsson, Stockholm, Sweden

[21] Appl. No.: 10,336

[22] Filed: Jan. 28, 1993

[51] Int. Cl.⁶ .................................... H04B 1/04
[52] U.S. Cl. .................. 455/126; 455/103; 455/119; 330/149; 375/261
[58] Field of Search .................... 455/126, 127, 455/101, 103, 104, 115, 119, 118; 375/38, 39, 260, 261; 330/149, 84, 124 R, 295; 332/119, 108, 151

[56] References Cited

U.S. PATENT DOCUMENTS

| | | | |
|---|---|---|---|
| 4,490,684 | 12/1984 | Epsom et al. | 330/149 |
| 4,560,945 | 12/1985 | Olver | 330/149 |
| 4,726,071 | 2/1988 | Jachowski | 455/125 |
| 5,066,923 | 11/1991 | Gailus et al. | 330/107 |
| 5,124,665 | 6/1992 | McGann | 455/126 |
| 5,134,718 | 7/1992 | Gailus | 455/102 |
| 5,140,627 | 8/1992 | Dahlin | 379/60 |
| 5,163,181 | 11/1992 | Koontz | 455/103 |
| 5,257,415 | 10/1993 | Kumagai et al. | 455/126 |
| 5,302,914 | 4/1994 | Arntz et al. | 455/103 |

FOREIGN PATENT DOCUMENTS

| | | | |
|---|---|---|---|
| 0271347 | 6/1988 | European Pat. Off. | |
| 0029008 | 3/1978 | Japan | 455/103 |
| 0143719 | 6/1990 | Japan | 455/119 |

OTHER PUBLICATIONS

*Linearization Of RF Power Amplifiers Using Cartesian Feedback*, Mats Johansson, Dept. of Applied Electronics, Lund University, Lund, Sweden, (Dec., 1991).

Johansson et al, "Transmitter Linearization Using Cartesian Feedback for Linear TDMA Modulation", 1991 pp. 439–444.

Primary Examiner—Reinhard J. Eisenzopf
Assistant Examiner—Doris To
Attorney, Agent, or Firm—Burns, Doane, Swecker & Mathis, L.L.P.

[57] ABSTRACT

A system for transmission of combined, multi-carrier signals wherein combiner/filters, commonly called combiners, have been eliminated. A cartesian feedback loop linearizes the system and thereby suppresses carrier frequency intermodulation by feeding back a portion of the combined multi-carrier signal to each channel device.

17 Claims, 3 Drawing Sheets

CARTESIAN MULTICARRIER FEEDBACK

BACKGROUND

The present invention generally relates to radio transmitters and, more particularly, to radio transmitters used in base stations of cellular radio systems.

In cellular radio systems, transmissions from a base station can comprise signals from many different channels which are combined prior to transmission by an antenna or antennas. These signals need to be distinctly spaced from one another in frequency so that they can be separated after reception without severe intermodulation. Conventionally, this has been achieved by using combiner/filters, commonly just called combiners, which comprise multiple tuned cavity devices that allow simultaneous transmission of signals from a plurality of transmitters at different but closely spaced frequencies by way of a single antenna.

Typically, combiners include one tuned cavity for each frequency. Each of the tuned cavities is coupled to a separate transmitter and is also coupled to an antenna. Combiners, however, have always been troublesome because numerous external influences cause the tuned cavities to become detuned. For example, normal temperature changes cause variations in the critical dimensions of these tuned cavities. Detuning of the cavities results in a substantial increase in insertion losses, thereby decreasing the amount of transmitter power that reaches the antenna. These problems are particularly acute in cellular telecommunication systems. One solution for overcoming temperature-caused detuning is to manufacture the tuning cavities from Invar, an expensive metal which must be coated with copper to provide the necessary high surface conductivity required of tuned cavities used in high frequency transmission systems.

Even this expensive solution, however, fails to prevent detuning due to other environmental factors such as variations in humidity and atmospheric pressure. Retuning the resonant frequencies of these cavities can also be accomplished manually or by computer control of tuning elements in the cavities, however, these solutions are also expensive and create other problems. Moreover, the combiner is physically bulky and takes up space in the base station which could be used for other purposes.

SUMMARY

The present invention provides, among other advantages and objects, for a multi-carrier transmission system in which the expensive and bulky combiners are eliminated. Further, separation characteristics between adjacent channels can be enhanced and a gain in output power can be achieved according to exemplary embodiments of the present invention.

These advantages and objects are realized, for example, by one exemplary embodiment of the present invention wherein the various channel signals are summed, then amplified and a portion of the amplified output signal is fed back via a cartesian feedback loop to the I and Q reference input basebands. This feedback serves to suppress frequency intermodulation while maintaining channel separation.

According to another exemplary embodiment, the intermediate frequency band is upconverted after the channel frequencies have been summed and the loop signal is downconverted prior to being fed back to the reference basebands.

BRIEF DESCRIPTION OF THE DRAWINGS

These and other features, objects and advantages of the present invention will become more apparent when the following detailed description is read in conjunction with the drawings in which.

DETAILED DESCRIPTION

Figure 1:
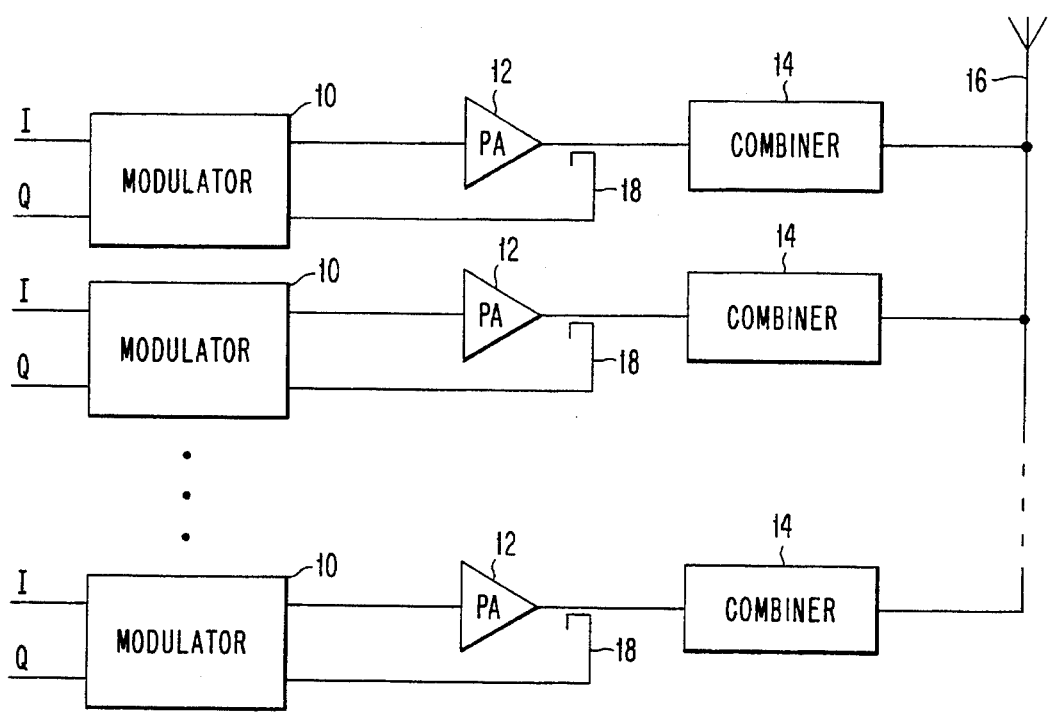
FIG. 1 illustrates a block diagram of a conventional transmission system.

FIG. 1 illustrates a conventional transmission system for a radio telecommunication system which can, for example, be located in a base station of a cellular system. Each transmission branch shown in FIG. 1 corresponds to a channel used for communications in the system. Similarly numbered elements in FIG. 1 operate in a similar manner. Although only three branches have been illustrated for simplicity, many branches will be provided in a typical system as reflected by the broken lines in FIG. 1. The operation of an exemplary branch is as follows.

The information carrying I (inphase) and Q (quadrature) baseband drive signals are applied to the modulator 10 which, typically, upconverts the signals to a higher transmission frequency and sums the components. This composite signal is then amplified by the rf frequency power amplifier 12 and filtered by combiner/filter 14 to ensure crisp frequency separation when combined with the other signals transmitted via antenna 16. A cartesian feedback loop 18 samples the power output from power amplifier 12 and is used to compensate for the nonlinearities introduced by the power amplifier. Operation of the cartesian feedback loop is discussed in more detail below with respect to FIG. 2.

Figure 2:
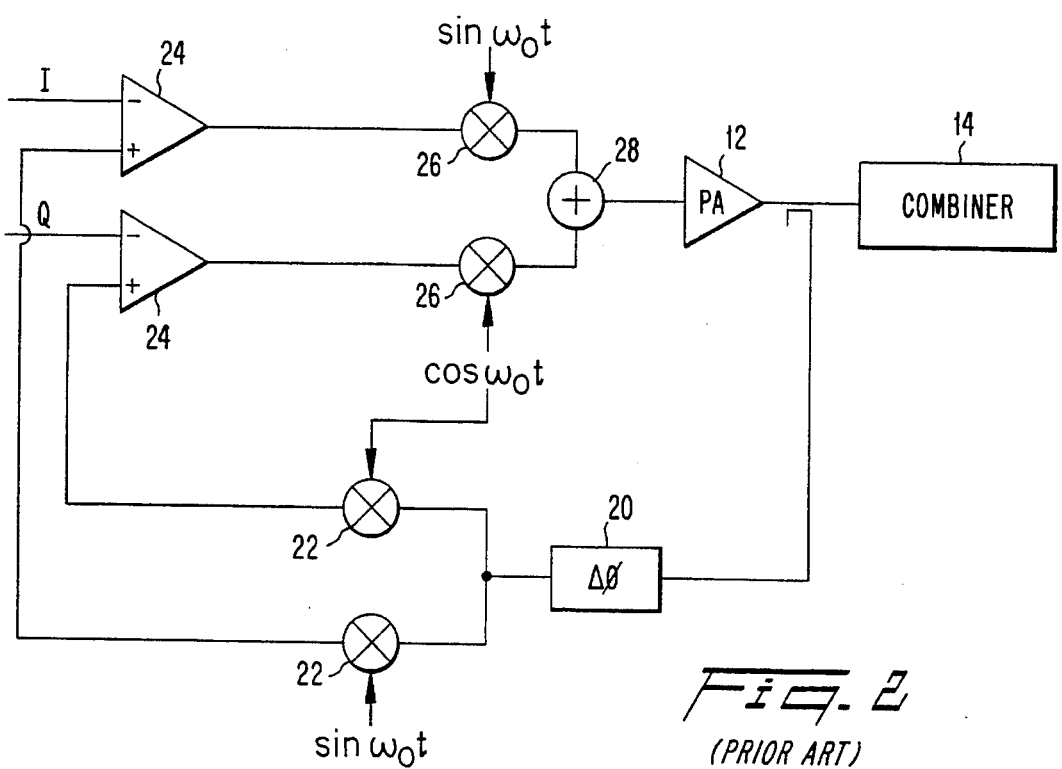
FIG. 2 illustrates the in more detail the modulator and cartesian feedback loop used in FIG. 1.

FIG. 2 is a more detailed block diagram of one of the branches of the conventional system of FIG. 1 which illustrates how the cartesian feedback loop operates. Cartesian feedback loops for single-carrier environments are disclosed for example in "Linearization of RF Power Amplifiers Using Cartesian Feedback" authored by Mats Johansson, which is hereby incorporated by reference. Again, similarly numbered elements function as described in FIG. 1.

A portion of the signal output from power amplifier 12 is synchronously demodulated into its components by means of the phase correction device 20 and the frequency downconverters 22. The demodulated feedback signal components are then subtracted from the I and Q baseband signals in comparators 24. The resultant quadrature component signals are then upconverted at blocks 26 and summed at block 28 prior to being amplified and filtered at blocks 12 and 14, respectively. The resultant signal is then combined with those signals of other channels and transmitted via an antenna as discussed above with respect to FIG. 1.

The cartesian feedback loop provided in this conventional system compensates for drifts in nonlinearities introduced by the power amplifier which are caused, for example, by temperature changes, DC power variations, load changes and component aging. However, the problems discussed previously that are associated with the conventional combiner are not solved by this conventional usage of cartesian feedback techniques.

Figure 3:
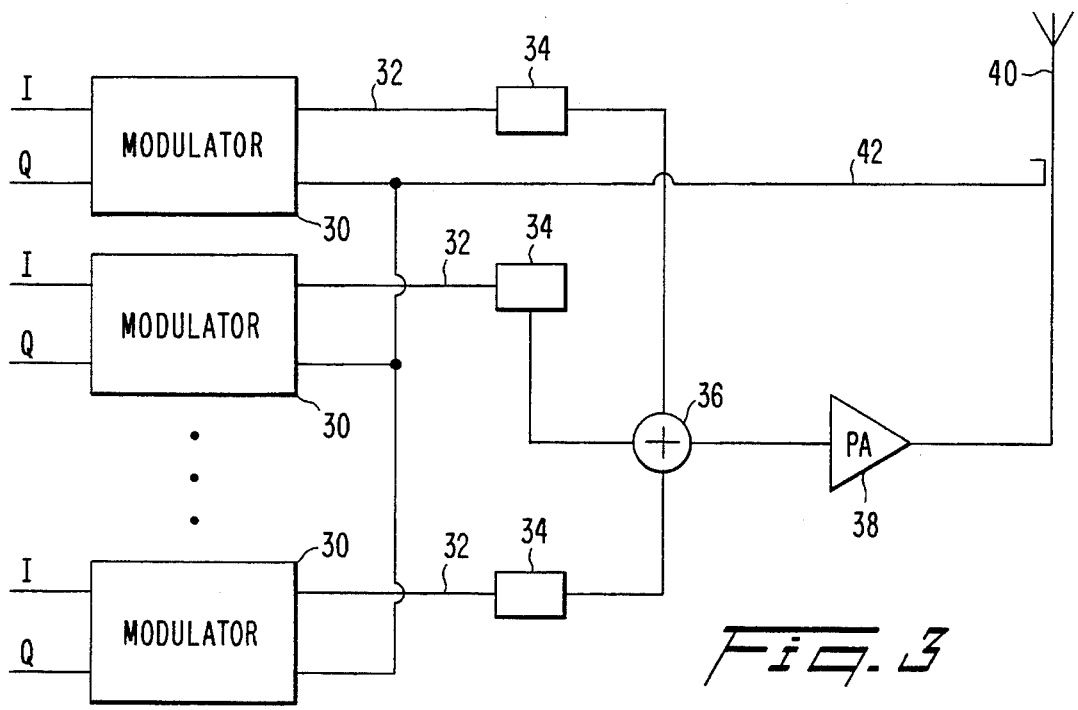
FIG. 3 shows a block diagram of a transmission system according to an exemplary embodiment of the present invention.

Thus, according to an exemplary embodiment of the present invention, illustrated in FIG. 3, a transmission system has been designed wherein the combiner has been eliminated. The operation of this system is as follows.

In a manner similar to that used to illustrate the conventional system of FIG. 1, only three branches are shown in the illustrative block diagram of this exemplary embodiment of the present invention, however, those skilled in the art will readily appreciate that such a system can have as many branches as necessary to correspond to the number of channels used in the system. Again, the operation of a single branch will be described as operation of the other channel branches is similar thereto.

The baseband quadrature components I and Q are input to the modulator 30 wherein the components are upconverted to a predetermined rf transmission frequency assigned to the corresponding channel and summed thereafter. This signal is output on line 32 to the phase compensator at block 34 where the phase of each channel signal is adjusted prior to summation. Although the phase compensator 34 has been illustrated in the exemplary embodiments as a separate element, the phase compensators could also be formed integrally with the modulators 30. The resultant signal is summed at block 36 with the same signals of the other channels. This composite signal is then amplified by the rf power amplifier 38 before being transmitted via antenna 40. A cartesian feedback loop 42 samples the combined, multi-carrier signal which is then demodulated and compared with the reference baseband components in each of the modulators 30 in the same manner in which the single carrier output signal was processed as described above with respect to FIG. 2.

Thus, according to this exemplary embodiment, the forward transmission circuit need not be highly linear because linearity is provided by the cartesian feedback loop, which is readily accomplished since very little power needs to be amplified in the feedback loop. In this way, intermodulation between the various carrier frequencies is suppressed. For example, without the cartesian feedback loop, signals having two different carrier frequencies, $f_1$ and $f_2$, which were summed and input to a nonlinear rf power amplifier would output a signal having significant intermodulation. The output of the nonlinear amplifier would comprise, for example, frequencies $f_1$, $f_2$, $2f_1-f_2$, $2f_2-f_1$, $3f_1-2f_2$, $3f_2-2f_1$, etc.

With the provision of the cartesian feedback loop which provides feedback on every possible intermodulation frequency, however, the intermodulation is suppressed by the gain in the cartesian feedback loop. Thus, if the carrier frequencies have approximately the same separation over the total transmitted bandwidth there is no need for the provision of a combiner.

Figure 4:
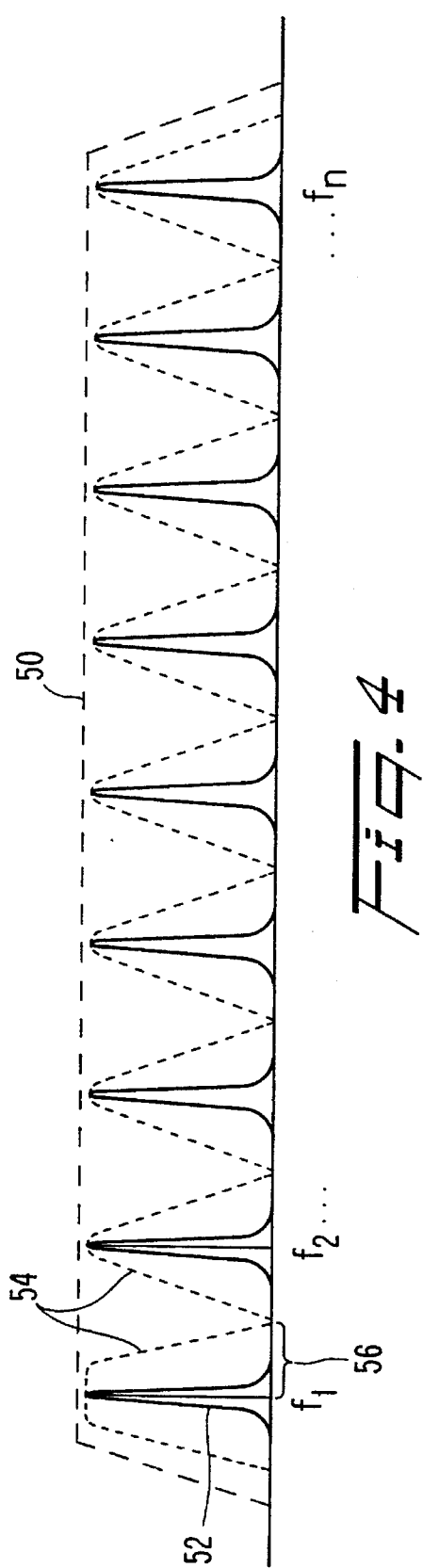
FIGS. 4 and 5 are exemplary waveforms illustrating channel separation achieved by the exemplary transmission system of FIG. 3.

FIG. 4 illustrates this feature of exemplary embodiments of the present invention by showing the bandwidth of the separated carrier frequencies as compared to the cartesian feedback loop bandwidth. The outer dotted line 50 represents a bandpass filter which excludes frequencies outside those used by the base station. The frequency spectrum for each channel signal is shown as centered about its corresponding carrier frequency, for example the frequency spectrum 52 relative to frequency $f_1$. The dotted lines 54 which surround each frequency spectrum denote the loop gain of the feedback loop. Note that the bandwidth 56 of the cartesian feedback loop is such that any intermodulation frequencies (e.g., frequencies between $f_1$ and $f_2$) would be suppressed by the loop gain.

Figure 5:
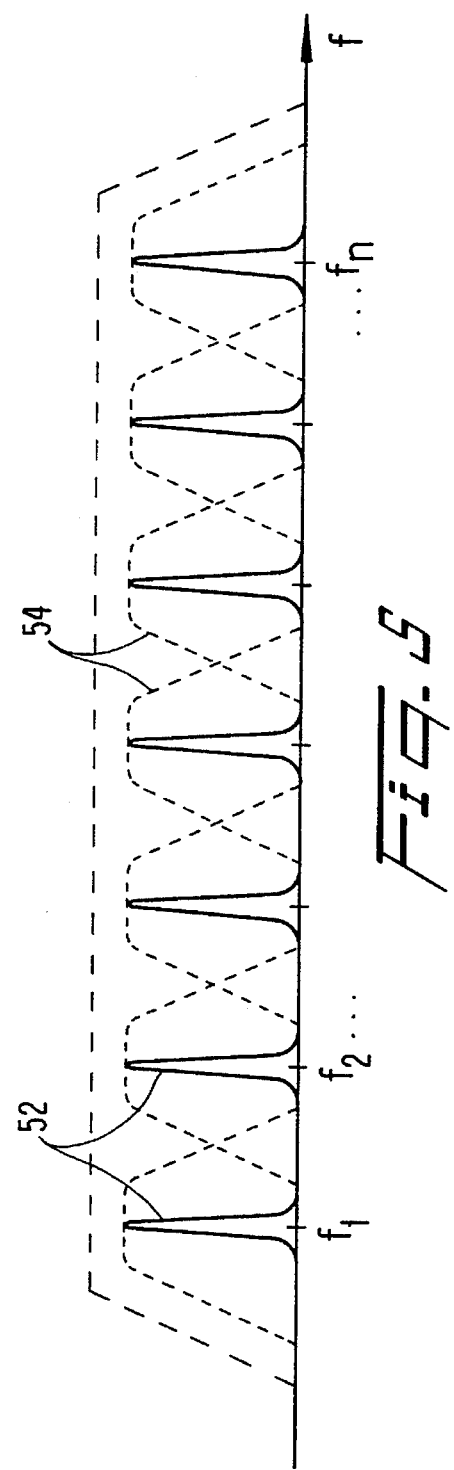

According to another embodiment, shown in FIG. 5 where the same reference numbers used in FIG. 4 are again used to identify similar features, the bandwidth of the feedback can be varied such that the loop bandwidths overlap at their edges. This can provide, for example, more freedom in varying the separation between carrier frequencies while still suppressing intermodulation.

Figure 6:
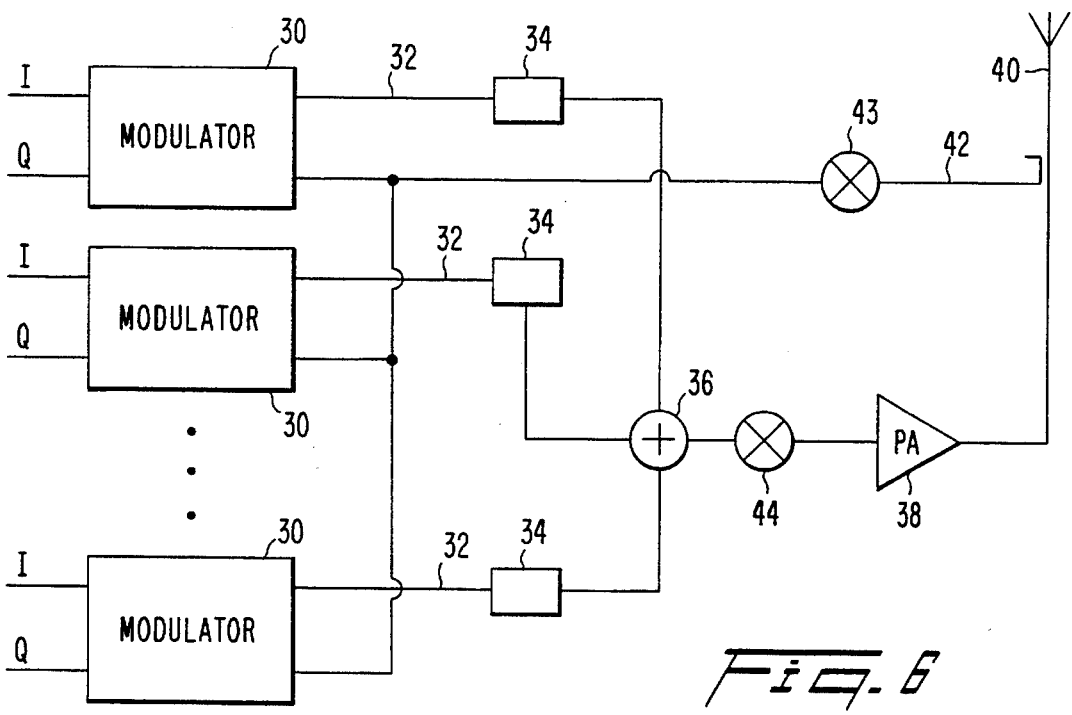
FIG. 6 shows a block diagram of a transmission system according to another exemplary embodiment of the present invention.

Another exemplary embodiment of the present invention is illustrated in FIG. 6 in which similar reference numerals are used to identify similar elements. This transmission system is identical to the system of FIG. 3 except that the reference baseband components are not upconverted to the transmission frequency in the modulators 10 nor is the feedback signal downconverted from the transmission frequency in the modulators 10. Instead, a downconverter 43 is placed in the feedback loop after sampling of the output signal and an upconverter 44 is placed after the summation block 36 and before the power amplifier 38. Thus, modulators 30 upconvert to, and downconvert from, an intermediate frequency. This makes implementation of a 90 degree phase shift network in quadrature modulators more easily accomplished and also generally reduces interference. The exemplary waveforms of FIGS. 4 and 5 can also be achieved using this exemplary embodiment and the discussion set forth above is equally relevant thereto.

Although the present invention has been described by way of the foregoing exemplary embodiments, it will be appreciated by those skilled in the art that the present invention can be embodied in other forms without departing from the spirit or essential character thereof. Thus, for example, other types of adaptive feedback techniques could be substituted for the cartesian feedback loop used in the exemplary embodiments described herein. Moreover, although the overall systems (e.g., base station) in which transmission systems according to the present invention can be used have not been described in detail, the present invention is intended to encompass the incorporation of the present invention therein. Thus, for example, the present invention readily lends itself to incorporation in any multicarrier transmission system, including FDMA systems and multi-carrier TDMA and CDMA systems. An exemplary system is disclosed in U.S. Pat. No. 5,140,627, entitled "Handoff Procedure that Minimizes Disturbance to DTMF Signalling in a Cellular Radio System", which is hereby incorporated by reference.

The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A system for transmitting combined, multi-carrier signals comprising:

channel modulation means for generating a modulated signal for each channel to be transmitted;

summing means for summing said modulated signals to generate a composite signal;

power amplifying means for amplifying said composite signal to generate a combined, multi-carrier signal including intermodulation products;

feedback means including a cartesian feedback loop for feeding back a portion of said combined, multi-carrier signal to said channel modulation means wherein said intermodulation products of said combined, multi-carrier signal are suppressed; and antenna means for transmitting said combined, multi-carrier signal.

2. The system of claim 1, wherein said modulated signal is an intermediate frequency signal.

3. The system of claim 2, further comprising:

upconverting means for upconverting said composite signal to a radio frequency prior to amplification by said power amplifying means.

4. The system of claim 3, further comprising:

downconverting means for downconverting said portion of said combined, multi-carrier signal from said radio frequency to said intermediate frequency prior to being fedback to said channel modulation means.

5. The system of claim 1 wherein said channel modulation means further comprises:

means for comparing components of said fedback portion of said combined, multi-carrier signal to I and Q baseband reference components to generate a loop error signal.

6. The system of claim 1 wherein said feedback means further comprises:

a cartesian feedback loop having a loop gain which suppresses intermodulation frequencies.

7. The system of claim 1 wherein said feedback means acts as a bandpass filter having a loop gain characteristic centered proximate each carrier frequency in said multi-carrier signal.

8. A method for transmitting combined, multi-carrier signals comprising the steps of:

inputting reference baseband signals for each channel to be transmitted;

generating a modulated signal based on each of said reference baseband signals;

summing together each modulated signal to generate a composite signal;

amplifying said composite signal to generate a combined, multi-carrier signal including intermodulation products;

suppressing said intermodulation products in said combined, multi-carrier signal by feeding back a portion thereof using a cartesian feedback loop to a modulator associated with said each channel;

and transmitting said combined, multi-carrier signal.

9. The method of claim 8, wherein said step of generating further comprises:

generating an intermediate frequency modulated signal.

10. The method of claim 9, further comprising the step of:

upconverting said composite signal to a radio frequency prior to amplifying said composite signal.

11. The method of claim 10, further comprising the step of:

comparing components of said fedback portion with said reference baseband signals prior to said generating step.

12. The method of claim 11 further comprising the step of:

downconverting said portion of said combined, multi-carrier signal from said radio frequency to said intermediate frequency prior to said comparing step.

13. The method of claim 8 further comprising the step of:

comparing components of said fedback portion with said reference baseband signals prior to said generating step.

14. The method of claim 8 wherein said step of suppressing further comprises the step of:

providing a cartesian feedback loop having a loop gain which maximizes carrier frequencies and minimizes intermodulation frequencies.

15. The method of claim 8 wherein said step of suppressing intermodulation further comprises the step of:

feeding back said portion of said combined, multi-carrier signal to effectively bandpass filter said combined multi-carrier signal with a loop gain centered on carrier frequencies of said combined, multi-carrier signal.

16. A system for transmitting a combined, multicarrier signal comprising:

a first and second modulator which generate a modulated signal for each of a first carrier frequency and a second carrier frequency to be transmitted, thereby generating a plurality of modulated signals;

an adder which adds said modulated signals to generate a composite signal;

a power amplifier which amplifies said composite signal to generate a combined, multi-carrier signal including intermodulation frequencies;

a cartesian feedback loop which returns a portion of said combined, multi-carrier signal to said first and second modulators having a loop gain which maximizes a return of said first and second carrier frequencies and suppresses a return of said intermodulation frequencies; and an antenna for transmitting said combined, multi-carrier signal.

17. The system of claim 16 wherein:

said feedback loop acts as a bandpass filter having said loop gain characteristic centered proximate each of said first and second carrier frequencies.

* * * * *